(12) United States Patent
Heo et al.

(10) Patent No.: US 7,221,094 B2
(45) Date of Patent: May 22, 2007

(54) ELECTROLUMINESCENT DEVICE AND METHOD OF MANUFACTURING THE SAME

(75) Inventors: Se Jun Heo, Busan (KR); Chang Hee Ko, Seoul (KR); Ju Won Lee, Jinju (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 201 days.

(21) Appl. No.: 10/645,846

(22) Filed: Aug. 22, 2003

(65) Prior Publication Data
US 2004/0108809 A1     Jun. 10, 2004

(30) Foreign Application Priority Data
Aug. 23, 2002  (KR) ................... 10-2002-0050131

(51) Int. Cl.
*H01J 17/49*     (2006.01)

(52) U.S. Cl. ................ 313/509; 313/500; 313/503; 313/505; 445/24; 445/25

(58) Field of Classification Search ........... 313/506, 313/509, 512, 49, 51, 583; 315/169.3; 257/91, 257/93, 99; 349/149, 152; 445/24
See application file for complete search history.

(56) References Cited

U.S. PATENT DOCUMENTS 5,911,614 A * 6/1999 Nishimura et al. ........... 445/25
6,222,315 B1   4/2001 Yoshizawa et al.
6,297,589 B1 * 10/2001 Miyaguchi et al. ......... 313/504
6,307,317 B1 * 10/2001 Codama et al. ............ 313/504
6,531,815 B1 *  3/2003 Okuyama et al. .......... 313/506
6,624,571 B1 *  9/2003 Toyoyasu et al. .......... 313/510
2004/0169464 A1 * 9/2004 Birnstock et al. ........... 313/504

FOREIGN PATENT DOCUMENTS

EP        1022931 A1 * 7/2000
JP       2000-235890     8/2000

* cited by examiner

*Primary Examiner*—Mariceli Santiago
(74) *Attorney, Agent, or Firm*—Stein, McEwen & Bui, LLP

(57) ABSTRACT

An electroluminescent display (EL) device and a method of manufacturing the same. The EL device includes a substrate, a first electrode unit including first electrodes formed on the substrate in a predetermined pattern, and first electrode terminals connected to the respective first electrodes; a second electrode unit including second electrodes formed on the first electrodes, and second electrode terminals connected to the respective second electrodes; an emission area formed where the first electrodes intersect the second electrodes, an electroluminescent layer disposed between the first electrodes and the second electrodes in the emission area, and an outer insulating layer between the emission area and the second electrode terminals; wherein the outer insulating layer comprises an insulating material formed to contact at least an edge of the second electrode terminals facing the emission area to reduce a steepness of a step between the second electrode terminal and the substrate.

20 Claims, 12 Drawing Sheets

ELECTROLUMINESCENT DEVICE AND METHOD OF MANUFACTURING THE SAME

CROSS-REFERENCE TO RELATED APPLICATIONS

This application claims the benefit of Korean Application No. 2002-50131, filed Aug. 23, 2002, in the Korean Intellectual Property Office, the disclosure of which is incorporated herein by reference.

BACKGROUND OF THE INVENTION

1. Field of the Invention

The present invention relates to an electroluminescent (EL) device, and, more particularly, to an improved EL device with a more secure patterning of fine electrodes, and a method of manufacturing the same.

2. Description of the Related Art

EL devices are self-emission type display devices, and much attention has recently been paid to the EL devices because they have advantageous features suitable for next generation devices, such as a wide viewing angle, a high contrast ratio, and a high response speed. EL devices are classified into inorganic EL devices and organic EL devices, according to the materials used for forming the light-emitting layers.

In particular, studies of organic EL devices have been extensively conducted because of their advantages, including good characteristics in terms of brightness and response speed, color displaying, and so on.

An EL device is basically configured such that an anode is formed on a transparent insulating substrate, e.g., a glass substrate, in a predetermined pattern, a light-emitting layer, consisting of organic or inorganic layers, is formed on the anode, and a cathode having a predetermined pattern is then stacked thereon so as to be orthogonal with the anode.

The organic or inorganic layers have at least a layered structure of a hole transport layer and a light-emitting layer sequentially stacked. As described above, the light-emitting layer is made of either an organic or inorganic material.

Usable materials of the organic layer include copper phthalocyanine (CuPc), N,N'-dinaphthalene-1-yl-N,N'-diphenyl-benzidine (NPB), and tris-8-hydroxyquinoline aluminum ($Alq_3$).

In the above-described EL device, when a drive voltage is applied to the anode and the cathode, holes from the anode migrate to the light-emitting layer, and electrons from the cathode migrate to the light-emitting layer. The holes and the electrons are recombined in the light-emitting layer to generate excitons. As the excitons are deactivated to a ground state, fluorescent molecules of the light-emitting layer emit light, thereby forming an image.

As described above, EL devices are classified into organic EL devices and inorganic EL devices according to the materials used for the light-emitting layers. An explanation will now be given by referring to an organic EL device.

FIG. 1 is a partially exploded perspective view of a conventional passive matrix type organic EL device. As shown, the conventional organic EL device includes a transparent substrate 11, an active area 20 for organic electroluminescence (to be briefly referred to as an active area, hereinbelow), a cap 12, an electrode terminal portion 30, and a flexible printed circuit board PCB 13. The active area 20 is formed on the substrate 11, and forms an image. The cap 12 is adhered to the substrate 11 and encapsulates the active area 20. The electrode terminal portion 30 supplies current to the active area 20, and extends outside the cap 12. The flexible PCB 13 is adhered to the electrode terminal portion 30 extending outside the cap 12, and connects circuits (not shown) for driving the active area 20. The electrode terminal portion 30 includes a first electrode terminal 32 and a second electrode terminal 34.

The active area 20 includes first electrodes, organic layers, and second electrodes on the substrate 11. The first electrodes are connected to the first electrode terminal 32, and can be spaced a predetermined interval apart from each other in a striped pattern. The organic layers are deposited on the first electrodes in a predetermined pattern. The second electrodes are formed on the organic layers such that they are insulated from the first electrodes and are electrically connected to the second electrode terminal.

In such an organic EL device, the organic layers formed at the active area 20 are formed of very thin layers, and the first electrodes and the second electrodes face each other with the organic layers interposed therebetween. Thus, the organic layers may be thinned at the edges of the first electrodes formed in a predetermined pattern, and short-circuits between the first electrodes and the second electrodes may be generated thereat. Also, short-circuits between each of the first electrodes may be generated.

In order to prevent short-circuits between the electrodes, a variety of techniques in which inner insulating films are formed between each of first electrodes have been proposed in U.S. Pat. Nos. 6,222,315, 6,297,589, and so on. In particular, each of the inner insulating films disclosed in U.S. Pat. No. 6,222,315 has a thickness which becomes gradually smaller toward each adjacent electrode, thereby preventing short-circuits at edge portions of the first electrodes.

FIG. 2 is a partially enlarged plan view of a portion "A" shown in FIG. 1, in which inner insulating films 26 are formed between each of the first electrodes 22. FIG. 3 is a cross-sectional view of the line I—I shown in FIG. 2.

In the drawings, the first electrodes 22 are generally formed of indium tin oxide (ITO). Each of second electrode terminals 34 includes a first terminal portion 34a and a second terminal portion 34b. The first terminal portion 34a is formed of ITO like the first electrodes 22. The second terminal portion 34b is formed of Cr, and compensates for a voltage drop due to line resistance.

As shown in FIGS. 2 and 3, an organic layer 28 and second electrodes 24 are sequentially formed. The second electrodes 24 are formed up to upper portions of the second electrode terminals 34, of the electrode terminal portions 30, to then be electrically connected to the second electrode terminals 34.

However, the following problems may arise in the connection between the second electrode terminals 34 and the second electrodes 24.

Whereas the first and second terminal portions 34a and 34b forming each of the second electrode terminals 34 have a height of several thousands of angstroms, the height of each of the second electrodes 24 covering the second electrode terminals 34, typically made of aluminum Al, is generally 1000 Å or less. As shown in FIG. 3, since the second electrode terminal 34 is spaced a predetermined distance apart from the active area 20, and no layers other than the second electrodes 24 exist therebetween, a predetermined step is generated between the substrate 11 and the second electrode terminal 34. Thus, it is required that the second electrodes 24 cover the second electrode terminal 34 while overcoming a step of the second electrode terminal 34 at a portion "B" shown in FIG. 3. In practice, however, the second electrodes 24 may be easily cut at the edge of the second electrode terminal 34, as shown in FIG. 4.

As shown in FIG. 4, the first terminal portion 34a and the second terminal portion 34b of the second electrode terminal 34 may be shaped such that the upper portions thereof protrude compared to the lower portions thereof. Thus, the second electrodes 24 may be disconnected at an edge, as indicated by reference symbol S.

In order to prevent the second electrodes from being disconnected at the edges, it is necessary to form the second electrodes more thickly. However, forming the second electrodes more thickly may deteriorate the current characteristics of an organic EL device, and may increase the driving voltage of a panel.

Further, the organic EL device may deteriorate due to electrostatic shock generated at contact portions between the second electrodes and the second electrode terminals.

As an effort to overcome these problems, Japanese Laid-open Patent Publication No. JP2000-235890 has disclosed a method of forming a port with a gently sloping end connected to an interconnect portion. However, both the port and the interconnect portion are as thin as tens to hundreds of micrometers, so that it is difficult to practically form such a thin port with the gently sloping end. Furthermore, although such a port can be manufactured, the resulting port has an undesirable step at its sloping end.

SUMMARY OF THE INVENTION

To solve the above-described problems, it is an aspect of the present invention to provide an electroluminescent (EL) device, and a method of manufacturing the same, which can prevent second electrodes from disconnecting at terminals thereof, by preventing generation of a step at terminals of the second electrodes.

Additional aspects and/or advantages of the invention will be set forth in part in the description which follows and, in part, will be obvious from the description, or may be learned by practice of the invention.

In accordance with an aspect of the present invention, there is provided an EL device comprising: a substrate; a first electrode unit comprising first electrodes formed on the substrate in a predetermined pattern, and first electrode terminals connected to the respective first electrodes; a second electrode unit comprising second electrodes formed on the first electrodes, and second electrode terminals connected to the respective second electrodes; an emission area formed where the first electrodes intersect the second electrodes; an electroluminescent layer disposed between the first electrodes and the second electrodes in the emission area; and an outer insulating layer between the emission area and the second electrode terminals; wherein the outer insulating layer comprises an insulating material formed to contact at least an edge of the second electrode terminals facing the emission area to reduce a steepness of a step between the second electrode terminal and the substrate.

The EL device may further comprise an inter insulating layer provided under the electroluminescent layer and covering a space between each of a plurality of lines of the first electrodes. In this case, the inter insulating layer may define the first electrodes.

According to various embodiments of the EL device, each of the second electrode terminals may include a first terminal portion made of indium tin oxide (ITO), and a second terminal portion made of chrome (Cr). The outer insulating layer may cover an edge of each of the second electrode terminals facing the emission area. The outer insulating layer may cover at least an edge of the first electrode closest to the second electrode terminals covered by the outer insulating layer. Via holes may be formed at portions of the outer insulating layer covering the edge of the second electrode terminals, so that the second electrodes and the second electrode terminals are electrically connected to each other, respectively, through the via holes.

The second electrodes may cover the outer insulating layer. The EL device may further comprise a first buffer layer insulated from the first electrodes and the second electrode terminals, wherein the first buffer layer is formed between the outer insulating layer and the substrate.

Another EL device according to an embodiment of the present invention comprises: a substrate; a first electrode unit comprising first electrodes formed on the substrate in a predetermined pattern, and first electrode terminals connected to the respective first electrodes; a second electrode unit comprising second electrodes formed on the first electrodes, and second electrode terminals connected to the respective second electrodes; an emission area formed where the first electrodes intersect the second electrodes; an electroluminescent layer disposed between the first electrodes and the second electrodes in the emission area; and an insulating layer formed under the electroluminescent layer; wherein the insulating layer is provided between each of a plurality of lines of the first electrodes, and at a space between the second electrode terminals and the first electrode adjacent thereto.

According to various embodiments of the above EL device, the insulating layer may be provided in a lattice form covering at least a space between each of the lines of the first electrodes and portions corresponding to the first electrodes in the emission area. The insulating layer may contact or cover an edge of the second electrode terminals facing the emission area outside the emission area, and may reduce a steepness of a step between the second electrode terminals and the substrate. The insulating layer may cover the second electrode terminals and an edge of the first electrode adjacent to the second electrode terminals. The EL device may further comprise a buffer layer insulated from the first electrodes and the second electrode terminals, wherein the buffer layer is formed between a portion of the insulating layer and the substrate, said portion of the insulating layer covering a space between the second electrode terminals and the first electrode adjacent thereto.

In accordance with another aspect of the present invention, there is provided a method of manufacturing an electroluminescent display EL device, the method comprising: forming first electrode terminals and second electrode terminals along edges of a substrate; forming first electrodes having a predetermined pattern, the first electrodes connected to the first electrode terminals; forming an insulating layer covering at least a space between each of a plurality of lines of the first electrodes and a space between the second electrode terminals and the first electrode adjacent thereto; forming an electroluminescent layer on at least each of the first electrodes; and forming second electrodes on the electroluminescent layer, wherein the second electrodes are connected to the second electrode terminals.

Regarding the above method, the insulating layer may cover at least a portion of each of the second electrode terminals and an edge of the first electrode adjacent to the second electrode terminals, wherein the edge of the first electrode faces the second electrode terminals.

In forming the insulating layer, via holes may be formed at portions of the insulating layer covering the second electrode terminals. In forming the first electrodes, a buffer layer may be formed at a space between the second electrode terminals and the first electrode adjacent thereto using the same material as that of the first electrodes, so as to be spaced a predetermined distance apart from, and insulated from, the first electrodes and the second electrode terminals.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
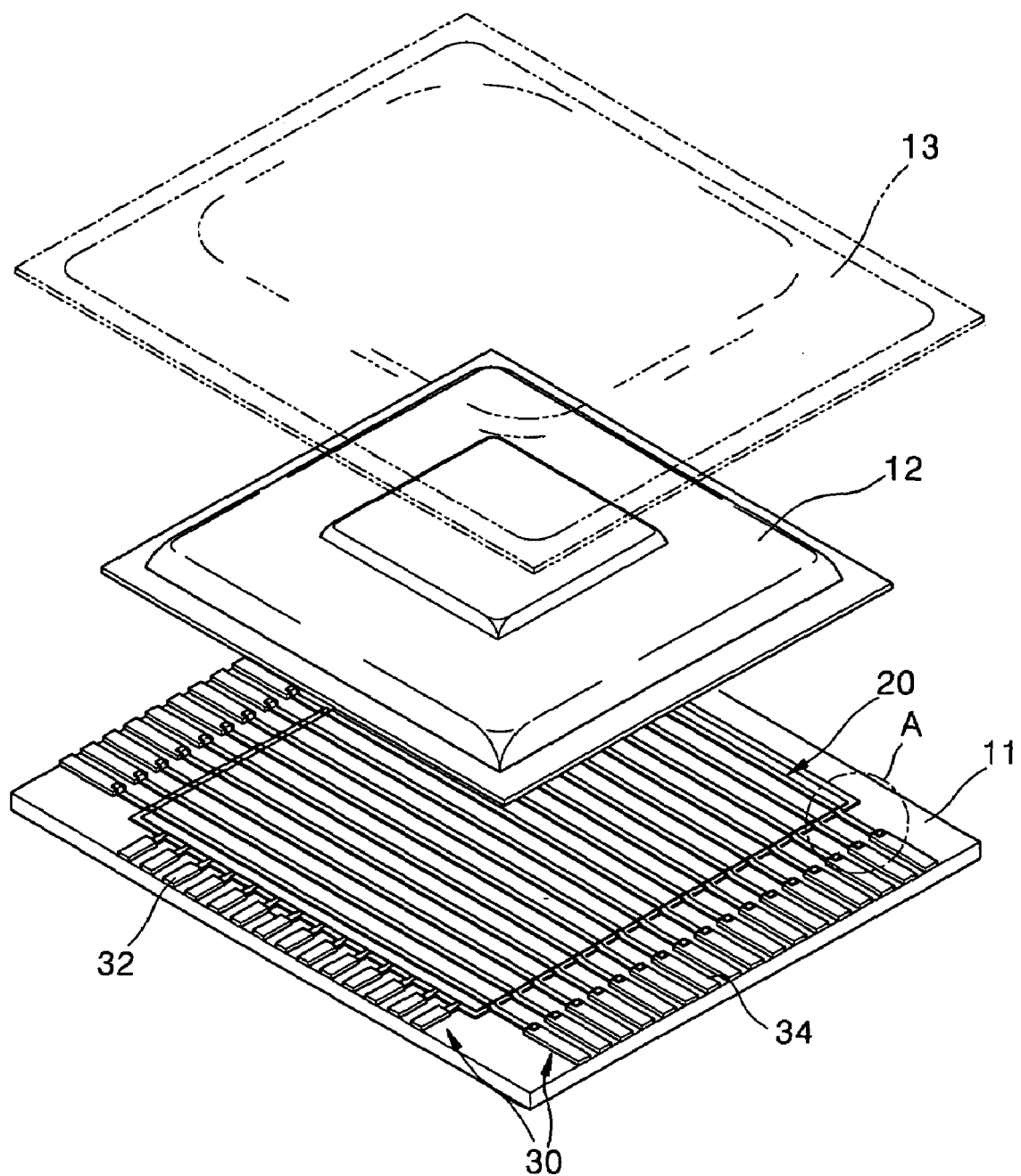
FIG. 1 is a partially exploded perspective view of a conventional organic EL device.
Figure 2:
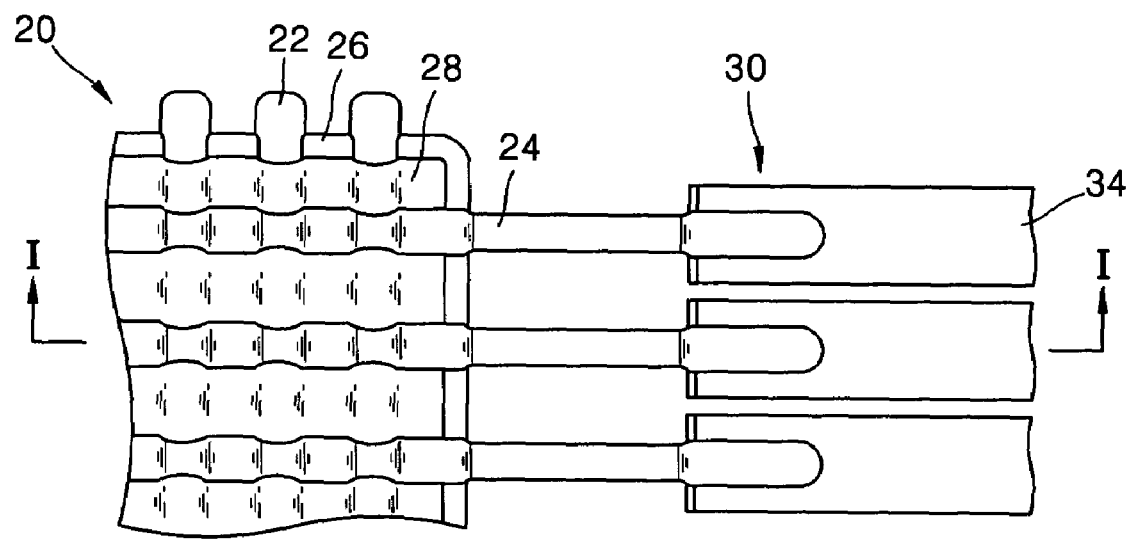
FIG. 2 is a partially enlarged plan view of a portion "A" shown in FIG. 1.
Figure 3:
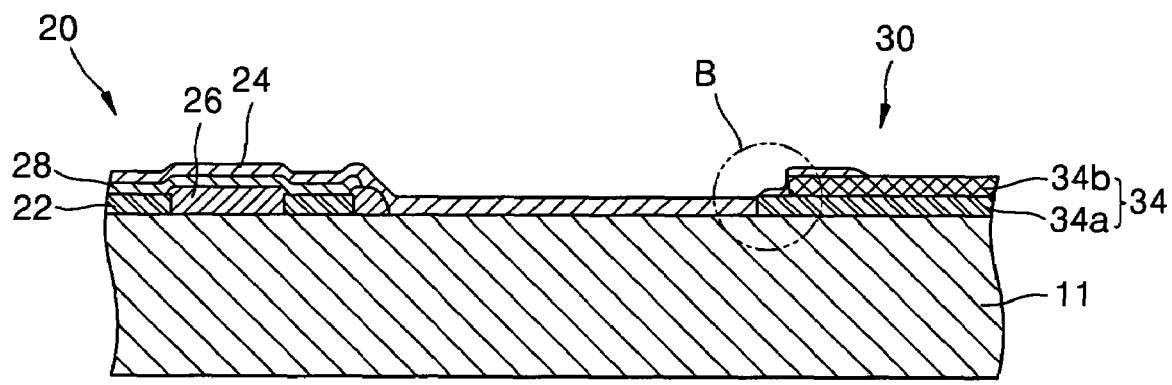
FIG. 3 is a cross-sectional view of the line I—I shown in FIG. 2.
Figure 4:
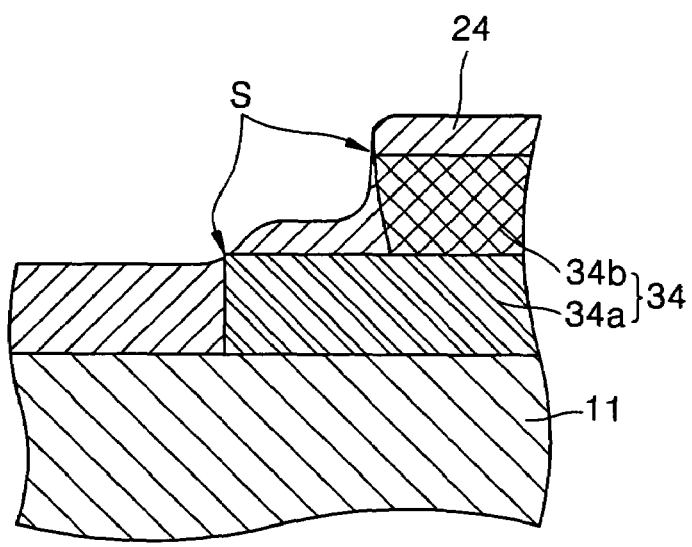
FIG. 4 is a partially enlarged plan view of a portion "B" shown in FIG. 3.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

The following description of embodiments of the present invention is directed mainly to the structure of an organic EL device in which organic compounds are used as light-emitting layers. However, the present invention can be applied in the same manner to an inorganic EL device using inorganic compounds as light-emitting layers.

Figure 5:
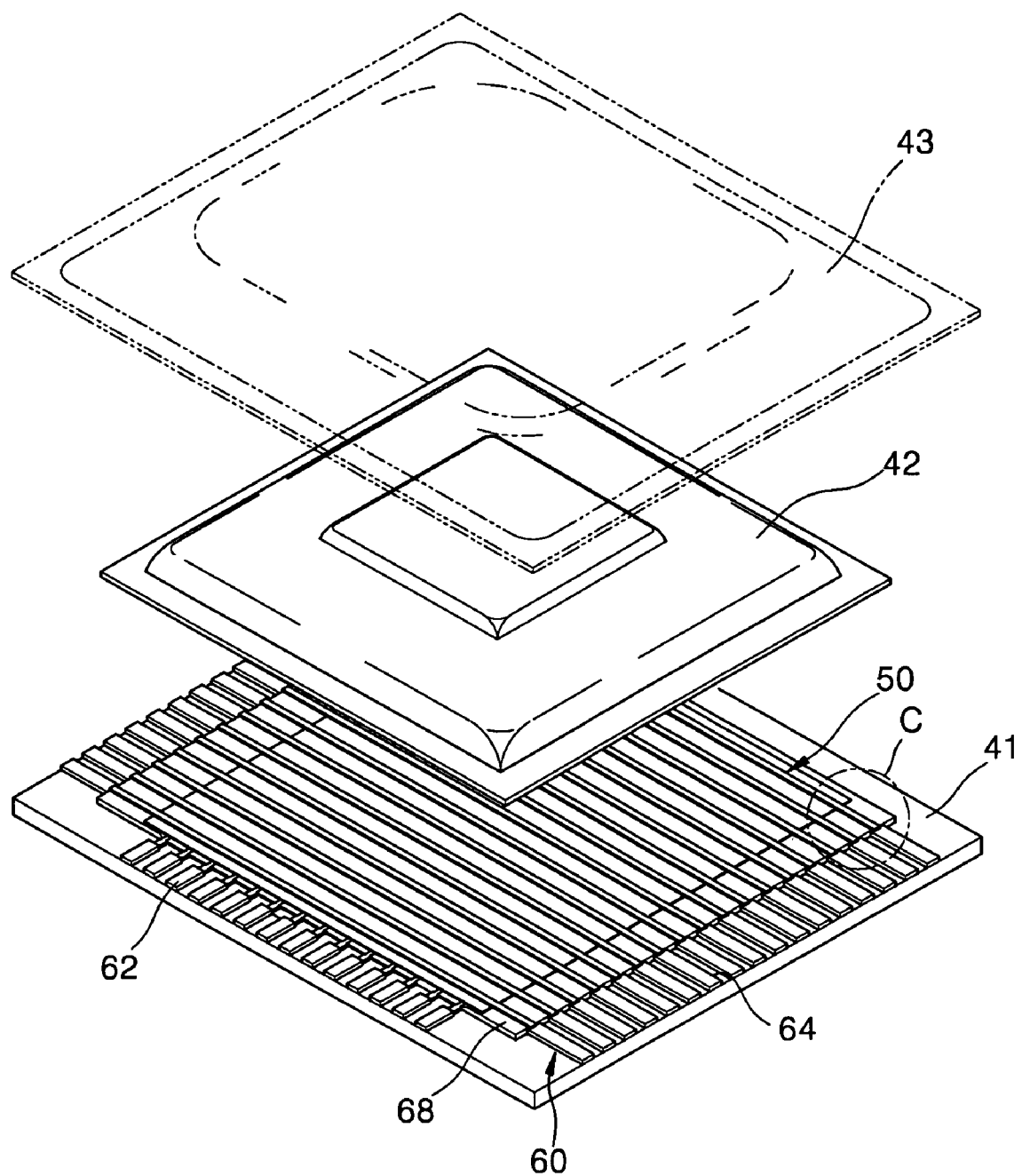
FIG. 5 is a partially exploded perspective view of an organic EL device according to an embodiment of the present invention.

FIG. 5 is a partially exploded perspective view of an organic EL device according to an embodiment of the present invention.

Referring to FIG. 5, the organic EL device according to an embodiment of the present invention includes a transparent substrate 41, an active area 50 which is formed on the substrate 41, and where an image is formed, a cap 42 adhered to the substrate 11 to encapsulate the active area 50, and a panel area 60 for supplying current to the active area 50, the panel area 60 extending outside the cap 42. A flexible printed circuit board 43 connecting circuits (not shown) for driving the organic EL device is mounted on the panel area 60 extending outside the cap 42. Such a basic configuration will also be applied to the following embodiments of the present invention.

Figure 6:
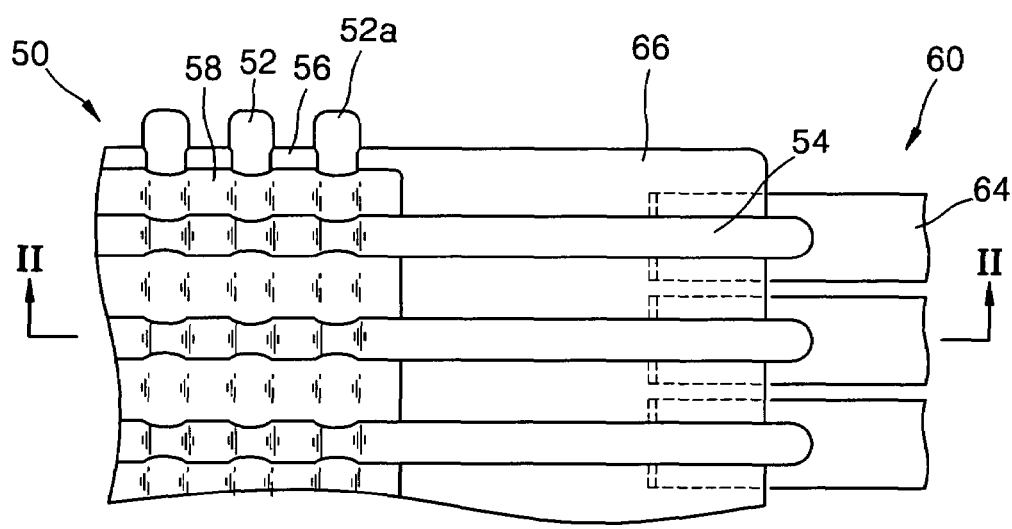
FIG. 6 is a partially enlarged plan view of a portion "C" shown in FIG. 5.
Figure 7:
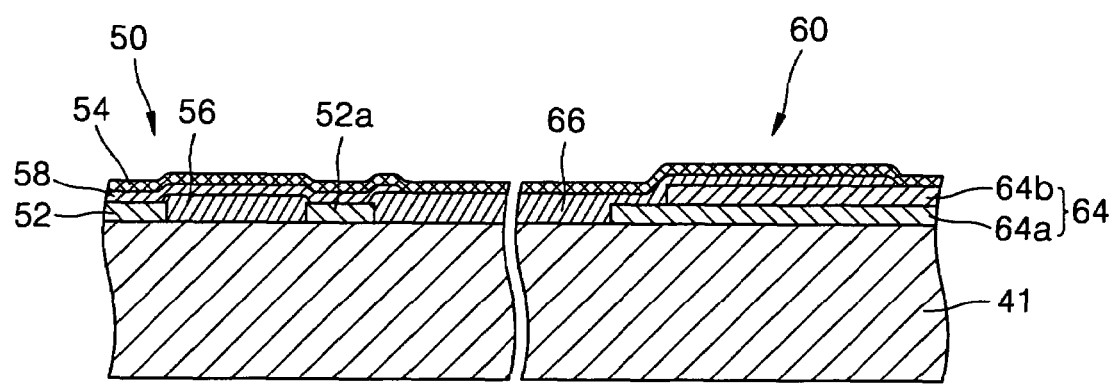
FIG. 7 is a cross-sectional view of the line II—II shown in FIG. 6.

FIG. 6 is a partially enlarged plan view of a portion "C" shown in FIG. 5, and FIG. 7 is a cross-sectional view of the line II—II shown in FIG. 6.

Referring to FIGS. 6 and 7, the active area 50 includes the organic EL device, including a plurality of first electrodes 52 arranged in a predetermined pattern on a transparent substrate 41, an electroluminescent layer 58 formed over the first electrodes 52, and a plurality of second electrodes 54 arranged over the electroluminescent layer 58 in a predetermined pattern. The first electrodes 52 may be formed of ITO, and the second electrodes 54 may be formed of aluminum (Al). The electroluminescent layer 58 emits light at the intersections of the first electrodes 52 and the second electrodes 54, thereby forming a predetermined image. Materials for forming the first electrodes 52 and the second electrodes 54, and patterns of the first electrodes and the second electrodes, are not limited to those stated above, and any usable materials and patterns can be employed. Also, any organic layers that can be used for organic EL devices can be used as the electroluminescent layer 58, in either a single or multiple layered structure having an emission layer, a hole transport layer, and/or an electron transport layer. Examples of usable organic materials include copper phthalocyanine (CuPc), N,N'-Dinaphthalene-1-yl-N,N'-diphenyl-benzidine (NPB), tris-8-hydroxyquinoline aluminum ($Alq_3$), and polymers such as PEDOT, poly-phenylenevinylene (PPV), or polyfluorene. The electroluminescent layer 58 can be formed in various patterns so as to correspond to colors of various pixels. The first electrodes 52, the second electrodes 54, and the electroluminescent layer 58 may be the same as those of all embodiments of the present invention to be described later. Although not shown, a buffer layer made of $SiO_2$, for maintaining smoothness of the top face of the substrate 41, and preventing impurities from being introduced from the substrate 41, may be further formed on the substrate 41, which may be applied in the same manner to all embodiments of the present invention to be described later.

In the active area 50, an inter insulating layer 56 may be further formed under the electroluminescent layer 58. The inter insulating layer 56 is formed for the purpose of keeping the first electrodes 52 insulated from each other, and insulation between the first electrodes 52 and the second electrodes 54 in a non-active area. The inter insulating layer 56 may be formed of an insulating material such as photoresist, or photosensitive polyimide, by photolithography. As shown in FIG. 7, the inter insulating layer 56 is formed to cover spaces between each of the lines of the first electrodes 52. Preferably, the inter insulating layer 56 is formed so as to contact or cover the edges of the first electrodes 52. This is for preventing the generation of a gap between the inter insulating layer 56 and each of the first electrodes 52. Although not shown, the inter insulating layer 56 may be formed not only at a space between each of the lines of the first electrodes 52, but also on the top surfaces of the first electrodes 52 not forming pixels. In other words, the inter insulating layer 56 may be formed on the top surface of the first electrodes 52 where the second electrodes 54 do not intersect with the first electrodes 52. In this case, the inter insulating layer 56 is defined as a matrix type.

As shown in FIG. 5, the panel area 60 includes first electrode terminals 62 formed at one side of the substrate 41, and second electrode terminals 64 formed at the other side of the substrate 41. In FIG. 5, the first electrode terminals 62 are formed at one side of the substrate 41, and the second electrode terminals 64 are formed at the other sides adjacent to the side where the first electrode terminals 62 are formed. However, locations at which the first and second electrode terminals 62 and 64 are formed are not limited to those shown in FIG. 5, and the first and second electrode terminals 62 and 64 can be formed at various locations.

In the panel area, each electrode terminal may include a lower, first terminal portion 64a and an upper, second terminal portion 64b, like in the second electrode terminal 64 shown in FIG. 7. The first terminal portion 64a may be formed of ITO, and the second terminal portion 64b may be formed of Cr. The second electrode 54 extends from the active area 50 toward the top surface of the second electrode terminal 64. Although not shown, the first electrode terminal 62 can also be formed in the same manner as the second electrode terminal 64. In this case, a first terminal portion 64a of the first electrode terminal 62 can be integrally formed with each first electrode.

In the above-described organic EL device according to an embodiment of the present invention, an outer insulating layer 66, made of an insulating material, is further formed between the active area 50 and the second electrode terminal 64 of the panel area 60. The outer insulating layer 66 is formed by extending the inter insulating layer outward from the outermost first electrode 52a, in the active area 50, toward the second electrode terminals 64. The outer insulating layer 66 is preferably formed so as to contact the edge of the second electrode terminals 64 facing the active area 50, that is, so as not to produce a gap between the active area 50 and the second electrode terminal 64. According to an embodiment of the present invention, the outer insulating layer 66 is formed to cover the edge of the second electrode terminals 64 facing the active area 50, as shown in FIGS. 6 and 7. By forming the outer insulating layer 66 in such manner, the steepness of the step formed by the second electrode terminals 64 and the top surface of the substrate 41 is reduced. Accordingly, cutting of the second electrode 54, which may occur due to the step between the second electrode terminals 64 and the top face of the substrate 41, can be prevented, because the step generated when the second electrode 54 extends from the active area 50 toward the top surface of the second electrode terminals 64 is not so steep. The shape of the outer insulating layer is not limited to that shown in FIG. 7, and any structure that can reduce a steepness of the step formed by the second electrode terminal 64 and the top surface of the substrate 41 can be employed.

Figure 8:
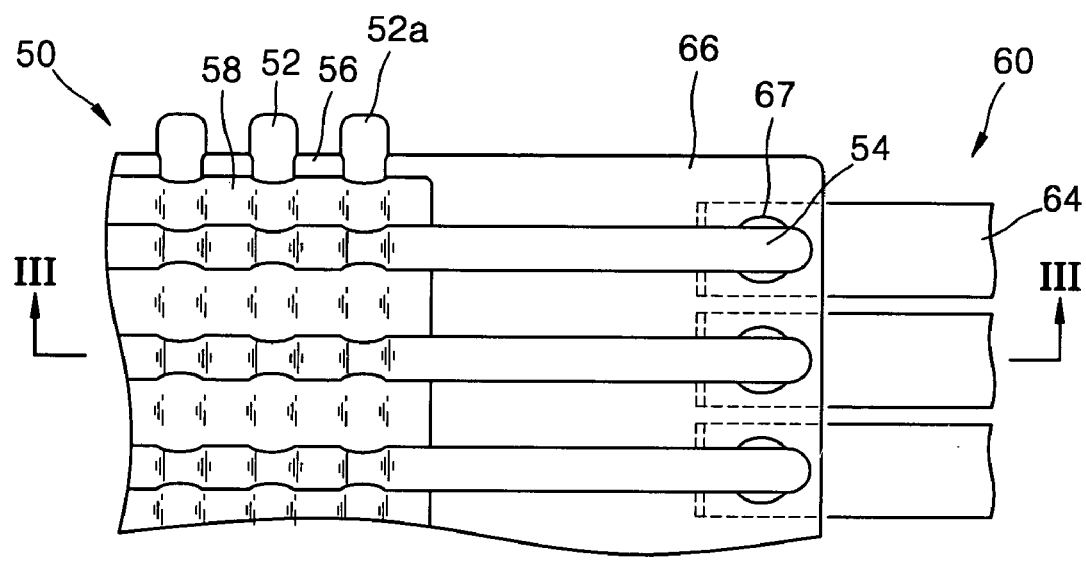
FIG. 8 is a partially enlarged plan view of an organic EL device according to another embodiment of the present invention.
Figure 9:
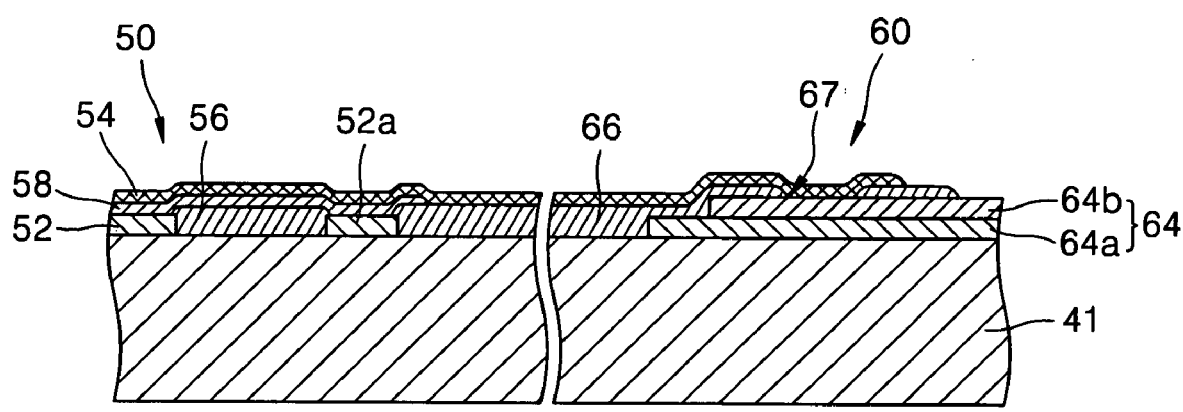
FIG. 9 is a cross-sectional view of the line III—III shown in FIG. 8.

FIGS. 8 and 9 are a plan view and a cross-sectional view of an organic EL device according to another embodiment of the present invention, in which FIG. 8 is a partially enlarged plan view of a panel area of the organic EL device, and FIG. 9 is a cross-sectional view of the line III—III shown in FIG. 8.

Referring to FIGS. 8 and 9, a via hole 67, through which the second electrode 54 and the second electrode terminal 64 are electrically connected to each other, may be further formed at a portion of the outer insulating layer 66 covering the edge of the second electrode terminal 64. Here, the second electrode 54 is not necessarily contacted with the second electrode terminal 64 over the outer insulating layer 66, and can be formed so as to pass through the via hole 67. Of course, the second electrode 54 may also be formed such that it passes over outer insulating layer 66 to reach the second electrode terminal 64.

As described above, the outer insulating layer 66 may be formed at a space between the second electrode terminals 64 and the active area 50, which is, however, very difficult in actual practice. In other words, the space between the second electrode terminals 64 and the active area 50 is much wider than that between each of the lines of the first electrodes 52. In order to form the outer insulating layer 66 in a wide area, the outer insulating layer 66 should have good adhesion at an interface between the outer insulating layer 66 and the substrate 41. If the adhesion at the interface between the outer insulating layer 66 and the substrate 41 is poor, the outer insulating layer 66 is not taken hold of by any medium in the course of manufacture, so that it may be partially damaged or cut. In an embodiment of the present invention, to overcome the problem, a buffer layer for taking hold of the outer insulating layer 66 may be further provided at the wide area.

Figure 10:
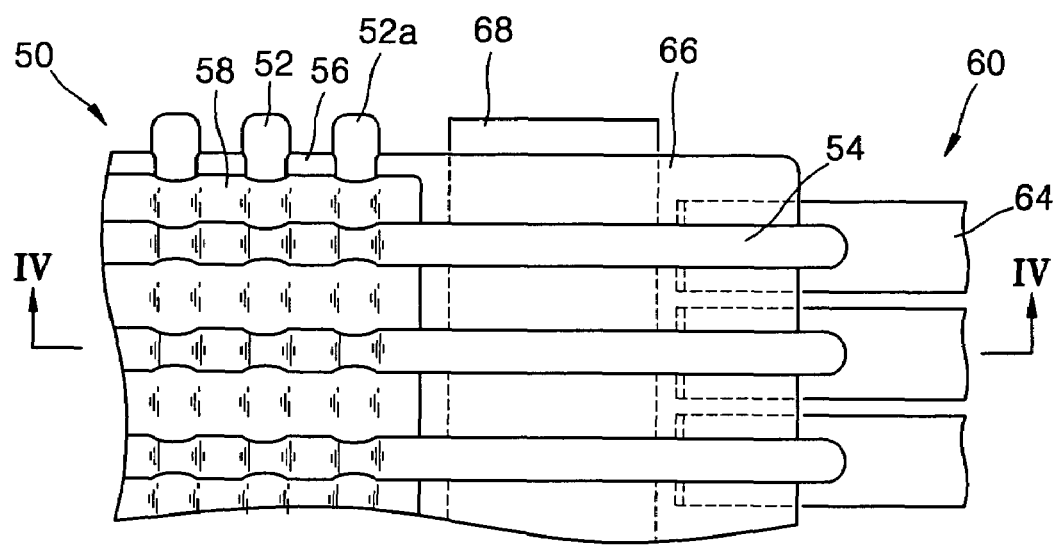
FIG. 10 is a partially enlarged plan view of an organic EL device according to still another embodiment of the present invention.
Figure 11:
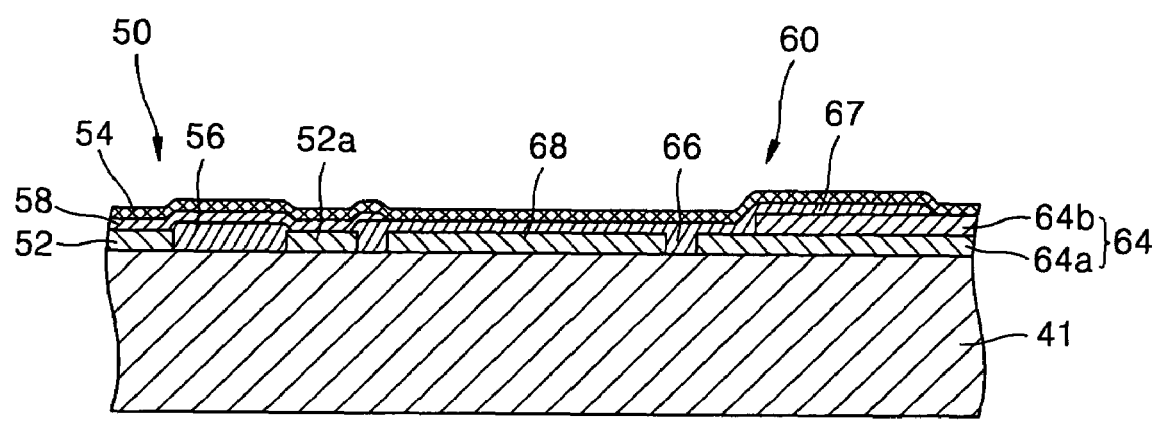
FIG. 11 is a cross-sectional view of the line IV—IV shown in FIG. 10.

FIGS. 10 and 11 are a plan view and a cross-sectional view of an organic EL device according to still another embodiment of the present invention, in which FIG. 10 is a partially enlarged plan view of the organic EL device, and FIG. 11 is a cross-sectional view of the line IV—IV shown in FIG. 10, illustrating an example of the buffer layer.

Referring to FIGS. 10 and 11, a buffer layer 68 is formed between the second electrode terminals 64 and the active area 50. In other words, the buffer layer 68 is formed between the edge of the second electrode terminals 64 facing the emission layer 50 and the outermost first electrode 52a in the active area 50, so that it is spaced a predetermined distance apart from and insulated from the second electrode terminals 64 and the outermost first electrode 52a. The buffer layer 68 may be formed of the same material as that of the first electrode 52, preferably ITO. Also, formation of the buffer layer 68 may be performed simultaneously with the patterning of the first electrodes 52, without performing a separate manufacturing step. Further, the buffer layer 68 can improve the adhesion between the outer insulating layer 66 and the substrate 41. Although not shown, like in FIGS. 8 and 9, a via hole, by which second electrodes 54 and second electrode terminals 64 are electrically connected to each other, may be formed at a portion of the outer insulating layer 66 covering the second electrode terminals 64.

A method of manufacturing an organic EL device according to an embodiment of the present invention will now be described.

FIGS. 12 through 16B illustrate a method of manufacturing an organic EL device according to an embodiment of the present invention.

Figure 12:
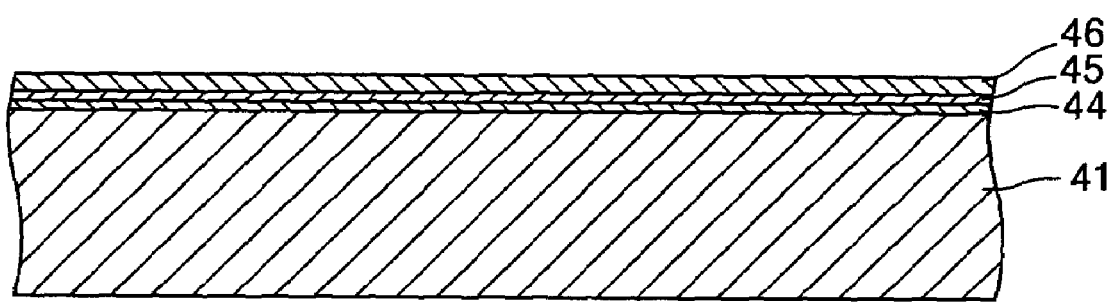
FIGS. 12 through 16B illustrates a method of manufacturing an organic EL device according to an embodiment of the present invention.

In order to manufacture the organic EL device, as shown in FIG. 12, a transparent substrate 41, having a transparent conductive layer 45 and a metal conductive layer 46 stacked thereon, is first prepared. The transparent conductive layer 45 may be formed of ITO, and the metal conductive layer 46 may be formed of Cr. The substrate 41 may be formed of transparent glass or plastic. Prior to forming the transparent conductive layer 45 and the metal conductive layer 46 on the substrate 41, a buffer layer 44 may be further provided on the substrate 41 in order to attain smoothness of the substrate 41, and to prevent infiltration of impurity elements from the substrate 41. The buffer layer 44 may be formed of $SiO_2$.

Figure 13A:
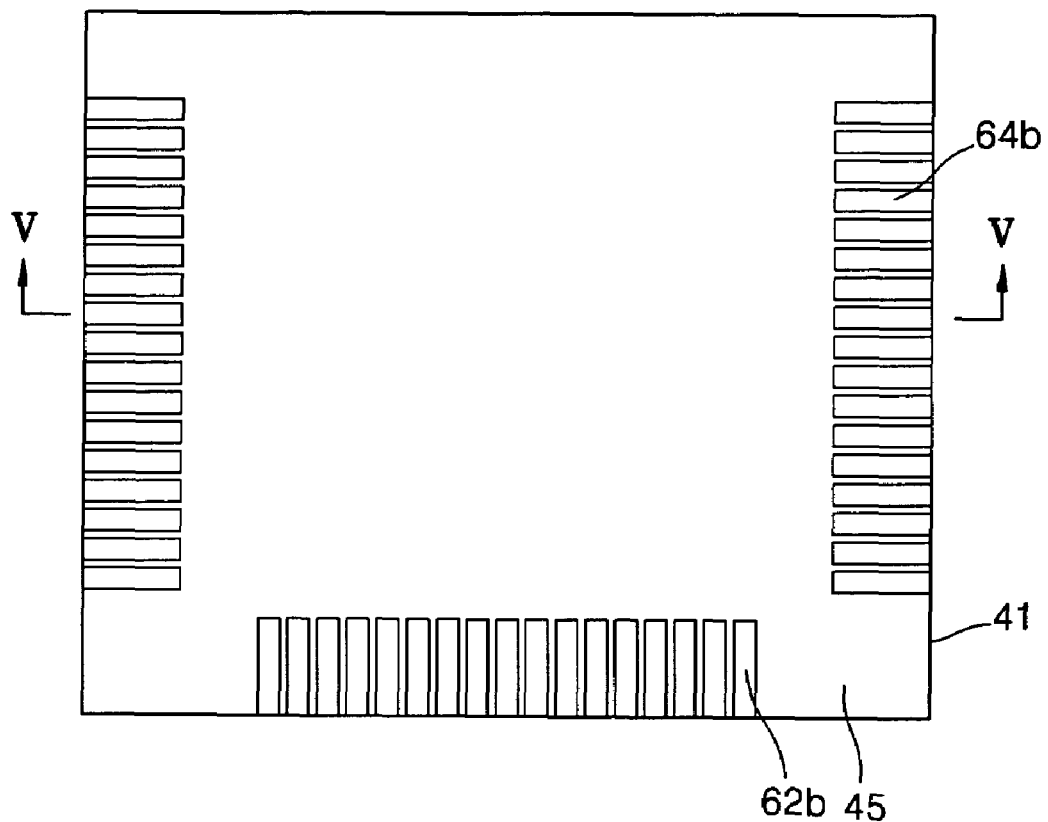
Figure 13B:
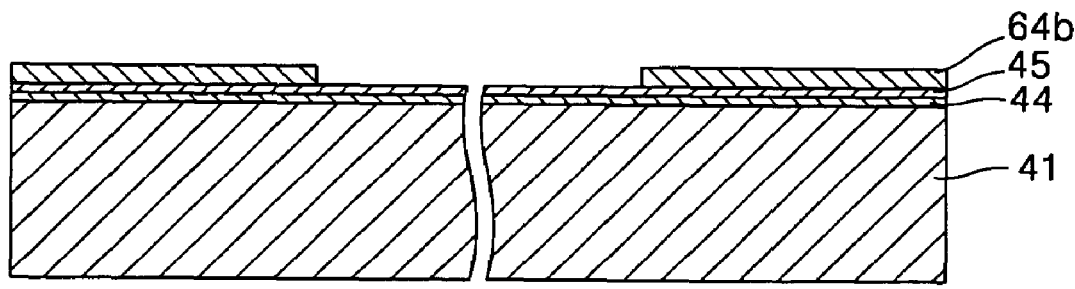

As shown in FIGS. 13A and 13B, the metal conductive layer 46 formed on the substrate 41 is processed to form second terminal portions 62b and 64b of the first and second electrode terminals 62 and 64, respectively, at the edges of the transparent substrate 41. FIG. 13B is a cross-sectional view of FIG. 13A taken along the line V—V, illustrating that the transparent conductive layer 45 forming the first and second electrode terminals 62 and 64 is exposed to the substrate 41.

Figure 14A:
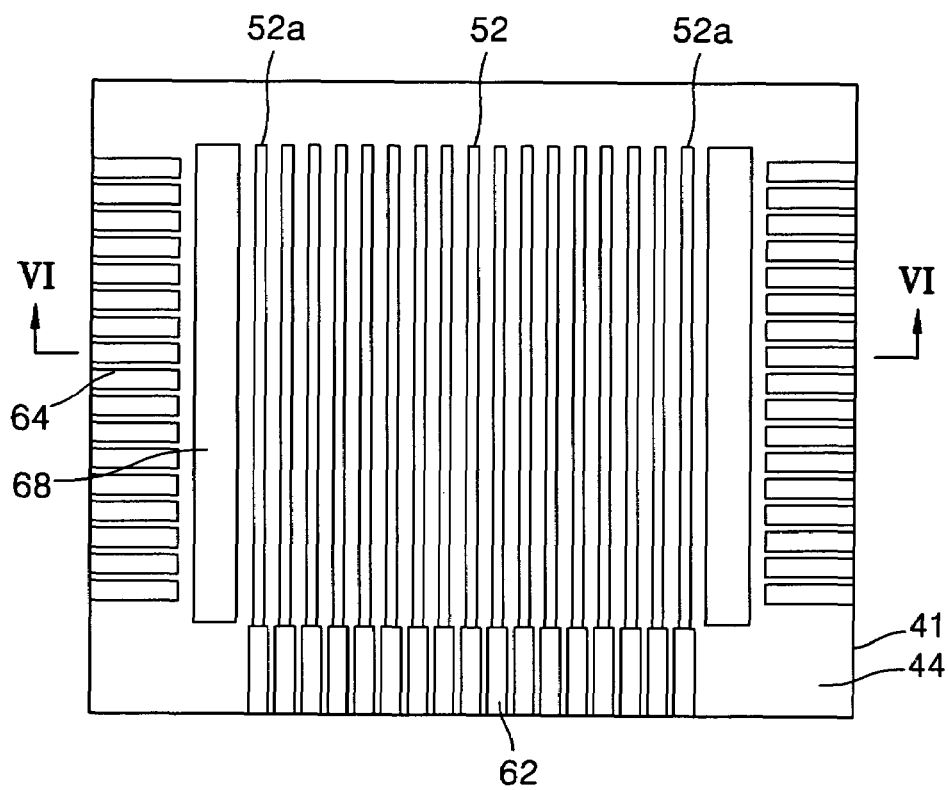
Figure 14B:
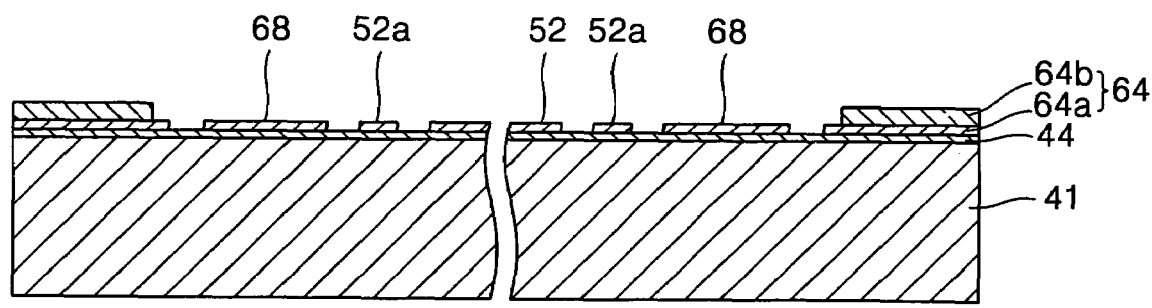

Next, as shown in FIGS. 14A and 14B, the transparent conductive layer 45 exposed to the substrate 41 is patterned to form the first and second electrode terminals 62 and 64, respectively, and the first electrodes 52, having a predetermined pattern, connected to the first electrode terminals 62, respectively. FIG. 14B is a cross-sectional view of FIG. 14A taken along the line VI—VI. As shown in FIG. 14B, a buffer layer 68, spaced a predetermined distance from the second electrode terminals 64 and the outermost first electrode 52a adjacent thereto, may be further formed therebetween. Here, patterning of the transparent conductive layer 45 may be performed by photolithography.

Figure 15A:
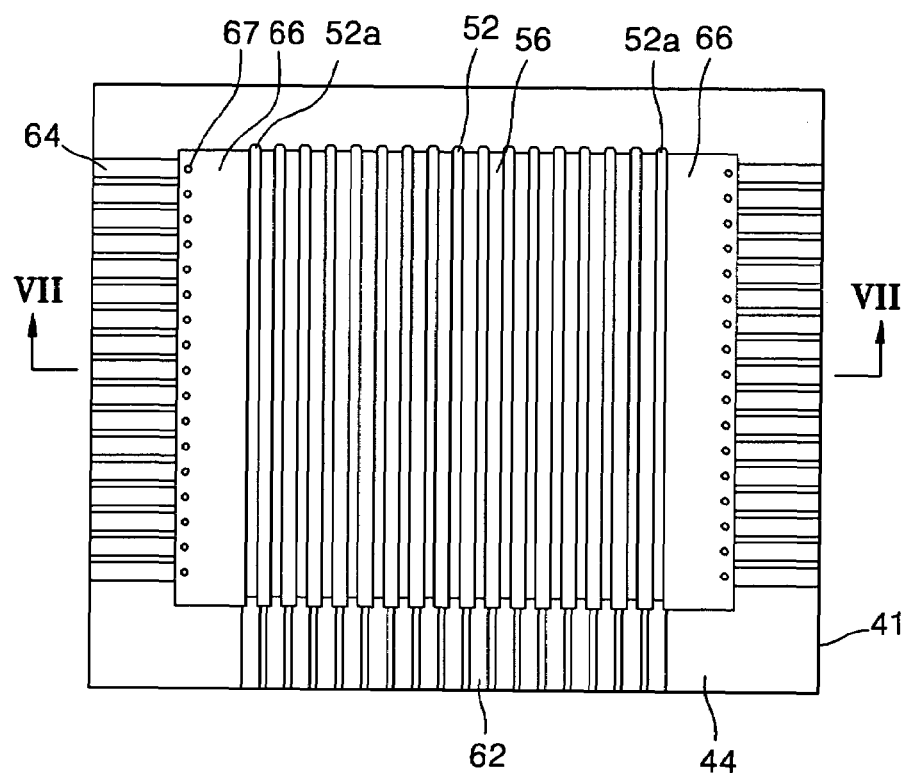
Figure 15B:
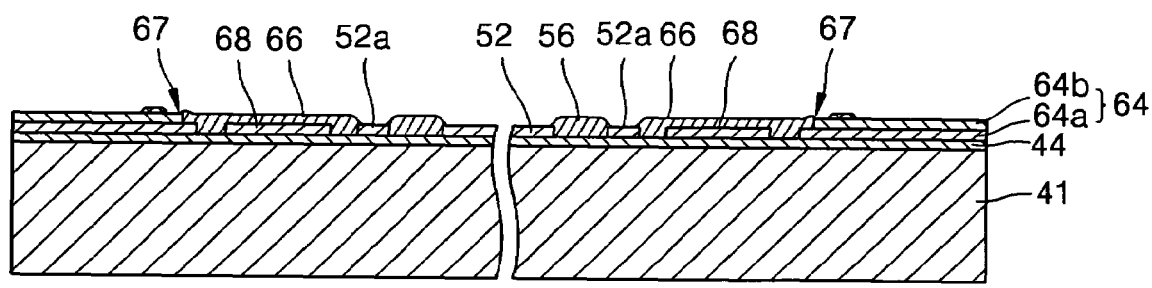

As shown in FIGS. 15A and 15B, an inter insulating layer 56 and an outer insulating layer 66 are formed. FIG. 15B is a cross-sectional view of FIG. 15A taken along the line VII—VII. The inter insulating layer 56 is formed at a space between each of the lines of the first electrodes 52, and the outer insulating layer 66 is formed at a space between the second electrode terminals 64 and the outermost first electrode 52a adjacent thereto so as to cover the buffer layer 68. In the outer insulating layer 66, via holes 67 are opened above the second electrode terminals 64. The inter insulating layer 56 may be formed in a striped pattern according to the patterns of the first electrodes 52, as shown in FIG. 15A. Although not shown, the inter insulating layer 56 may also be formed in a lattice pattern. Patterns of the inter insulating layer 56 and the outer insulating layer 66 are not limited to those described above, and various patterns can be employed, according to the patterns of the pixels. Formation of the inter insulating layer 56 and the outer insulating layer 66 may be performed by photolithography, using photoresist or photosensitive polyimide.

Separators for patterning the second electrodes 54, or partitions for preventing organic layers from being damaged due to a mask, can also be simultaneously formed with the inter insulating layer 56 and the outer insulating layer 66. Also, isolation walls for preventing an adhesive agent from flowing can be formed simultaneously with the inter insulating layer 56 and the outer insulating layer 66. Further, shielding portions may be simultaneously formed at portions where an adhesive agent is to be coated.

Figure 16A:
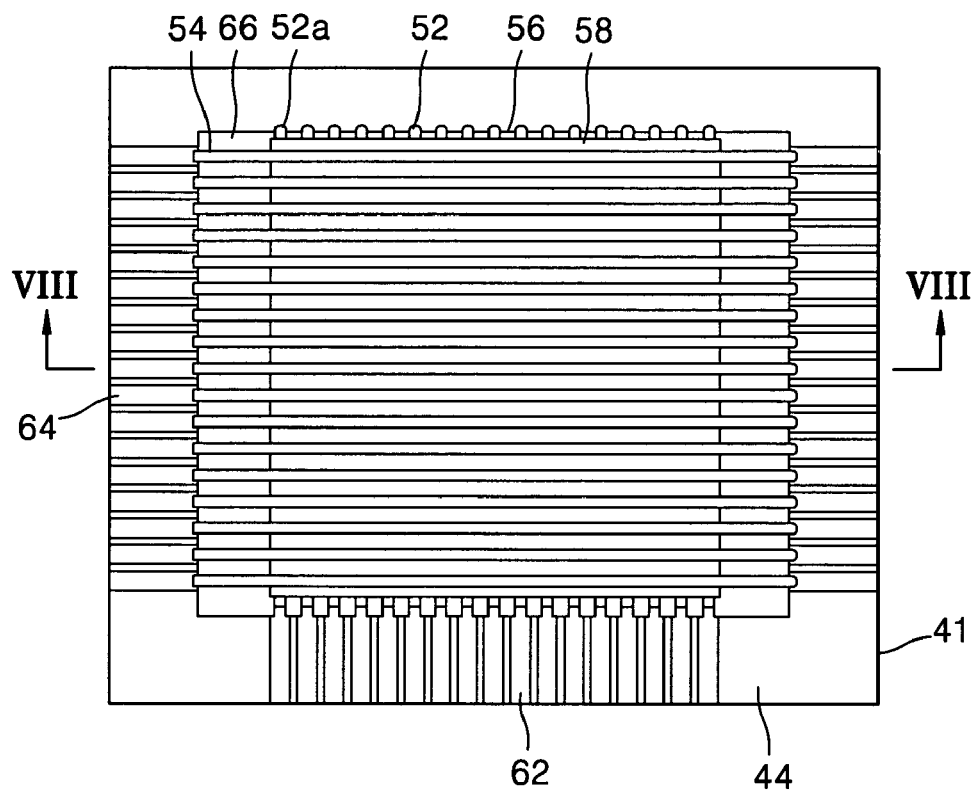
Figure 16B:
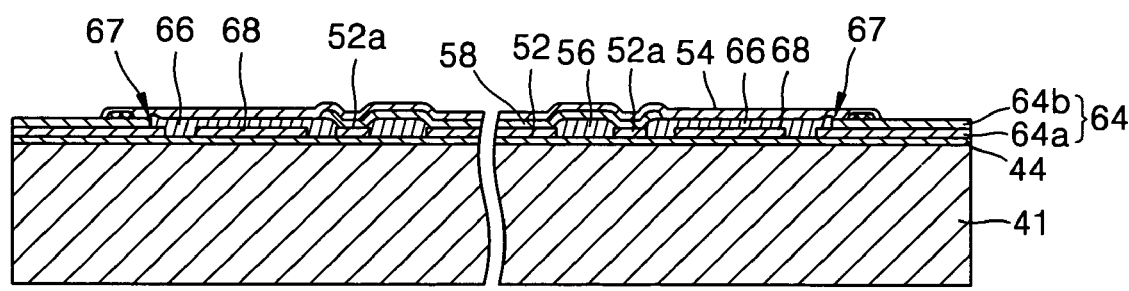

As shown in FIGS. 16A and 16B, an electroluminescent layer 58 is formed on the first electrodes 52, and then the second electrodes 54 are formed on the electroluminescent layer 58 so as to be connected to the second electrode terminals 64. The electroluminescent layer 58 and the second electrodes 54 may be formed in a predetermined pattern by deposition.

When formation of the electroluminescent layer and the second electrode is completed as described above, a cap for encapsulation is adhered to the substrate, and a flexible PCB is mounted thereon.

As described above, the present invention has the following effects. First, connection inferiority between second electrodes and second electrode terminals can be reduced by reducing a steepness of the step formed by the second electrode terminal and the top surface of the substrate. Second, since the thickness of the second electrode can be reduced, rectifying characteristics of a device can be improved. Third, deterioration due to the electrostatic shock typically occurring at a connected portion between the second electrodes and the terminals thereof can be prevented.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An electroluminescent display EL device comprising:
    a substrate;
    a first electrode unit comprising:
        first electrodes formed on the substrate as a plurality of parallel evenly spaced lines, and
        first electrode terminals connected to the respective first electrodes; a second electrode unit comprising:
        second electrodes formed in an orthogonal direction with respect to the first electrodes over the first electrodes, and
        second electrode terminals connected to the respective second electrodes;
    an emission area formed where the first electrodes intersect the second electrodes;
    an electroluminescent layer disposed between the first electrodes and the second electrodes in the emission area;
    an inter insulating layer provided under the electroluminescent layer and covering a space between each of the plurality of lines of the first electrodes and an edge portion of a top surface of each of the plurality of lines of the first electrodes;
    an outer insulating layer between the emission area and the second electrode terminals, wherein the outer insulating layer comprises an insulating material formed to contact at least an edge of the second electrode terminals facing the emission area so as to reduce a steepness of a step between the second electrode terminals and the substrate; and
    a buffer layer provided over a top surface of the substrate to maintain smoothness of the top surface of the substrate and to prevent impurities from being introduced from the substrate.

2. The EL device of claim 1, wherein the substrate comprises glass or plastic.

3. The EL device of claim 1, wherein the second electrode terminals comprise a lower terminal portion made of indium tin oxide (ITO) formed on the substrate, and an upper terminal portion made of chrome (Cr) formed on the lower terminal portion with a step facing the emission area.

4. The EL device of claim 1, wherein the first electrode terminals are integrally formed with the first electrodes.

5. The EL device of claim 1, wherein the outer insulating layer covers the edge of each of the second electrode terminals facing the emission area.

6. The EL device of claim 5, further comprising via holes formed at portions of the outer insulating layer covering the edge of the second electrode terminals, so that the second electrodes and the second electrode terminals are electrically connected to each other, respectively, through the via holes.

7. The EL device of claim 5, wherein the second electrodes pass over the outer insulating layer to contact the second electrode terminals.

8. The EL device of claim 1, wherein the outer insulating layer covers at least an edge of the first electrode closest to the second electrode terminals covered by the outer insulating layer.

9. The EL device of claim 1, wherein the second electrodes cover the outer insulating layer.

10. The EL device of claim 1, further comprising another buffer layer insulated from the first electrodes and the second electrode terminals, and disposed between the outer insulating layer and the substrate.

11. The EL device of claim 10, wherein the another buffer layer comprises a same material as the first electrodes.

12. The EL device of claim 11, wherein the another buffer layer and the first electrodes are comprised of ITO.

13. The EL device of claim 1, wherein the buffer layer comprises $SiO_2$.

14. An electroluminescent display EL device comprising:
a substrate;
a first electrode unit comprising:
first electrodes formed on the substrate as a plurality of parallel evenly spaced lines, and
first electrode terminals connected to the respective first electrodes;
a second electrode unit comprising:
second electrodes formed in an orthogonal direction with respect to the first electrodes over the first electrodes, and
second electrode terminals connected to the respective second electrodes;
an emission area formed where the first electrodes intersect the second electrodes;
an electroluminescent layer disposed between the first electrodes and the second electrodes in the emission area;
an insulating layer formed under the electroluminescent layer; and
a buffer layer provided on a top surface of the substrate to maintain smoothness of the top surface of the substrate and to prevent impurities from being introduced from the substrate;
wherein the insulating layer is provided between each of a plurality of lines of the first electrodes and an edge portion of a top surface of each of the plurality of lines of the first electrodes, and at a space between the second electrode terminals and the first electrode adjacent thereto, and
wherein the insulating layer covers an edge of the second electrode terminals facing the emission area outside the emission area, so as to reduce a steepness of a step between the second electrode terminals and the substrate.

15. The EL device of claim 14, wherein the insulating layer covers the second electrode terminals and an edge of the first electrode adjacent to the second electrode terminals, and wherein each of the second electrode terminals comprises a lower terminal portion made of indium tin oxide (ITO), and an upper terminal portion made of chrome (Cr).

16. The EL device of claim 14, further comprising a buffer layer insulated from the first electrodes and the second electrode terminals, wherein the buffer layer is formed between a portion of the insulating layer and the substrate, said portion of the insulating layer covering a space between the second electrode terminals and the first electrode adjacent thereto.

17. A method of manufacturing an electroluminescent display EL device, the method comprising:
forming first electrode terminals and second electrode terminals along edges of a substrate;
forming first electrodes having a predetermined pattern, the first electrodes connected to the first electrode terminals;
forming an insulating layer covering at least a space between each of a plurality of lines of the first electrodes, an edge portion of a top surface of each of the plurality of lines of the first electrodes, and at a space between the second electrode terminals and the first electrode adjacent thereto;
forming an electroluminescent layer on at least each of the first electrodes; and
forming second electrodes on the electroluminescent layer orthogonally with respect to the first electrodes,
wherein the second electrodes are connected to the second electrode terminals, and
wherein the insulating layer covers an edge of the second electrode terminals facing an emission area so as to reduce a steepness of a step between the second electrode terminals and the substrate, and
wherein a buffer layer is formed on a top surface of the substrate to maintain smoothness of the top surface of the substrate and to prevent impurities from being introduced from the substrate.

18. The method of claim 17, wherein the insulating layer covers at least an edge of each portion of the second electrode terminals, and wherein the second electrode terminals comprise a lower terminal portion formed on the substrate and an upper terminal portion formed on the lower terminal portion with a step facing the emission area.

19. The method of claim 18, further comprising forming via holes at portions of the insulating layer covering the second electrode terminals, during the forming of the insulating layer.

20. The method of claim 17, further comprising forming another buffer layer during the forming of the first electrodes, at a space between the second electrode terminals and the first electrode adjacent thereto using the same material as that of the first electrodes, so as to be spaced a predetermined distance apart from, and insulated from, the first electrodes and the second electrode terminals.

* * * * *

UNITED STATES PATENT AND TRADEMARK OFFICE
CERTIFICATE OF CORRECTION

| | | |
|---|---|---|
| PATENT NO. | : 7,221,094 B2 | Page 1 of 1 |
| APPLICATION NO. | : 10/645846 | |
| DATED | : May 22, 2007 | |
| INVENTOR(S) | : Se Jun Heo et al. | |

It is certified that error appears in the above-identified patent and that said Letters Patent is hereby corrected as shown below:

Column 10, line 14
start new paragraph after "electrodes;"

Signed and Sealed this

Twenty-eighth Day of August, 2007

JON W. DUDAS
*Director of the United States Patent and Trademark Office*